United States Patent [19]

Salt et al.

[11] 4,162,175

[45] Jul. 24, 1979

[54] TEMPERATURE SENSORS

[75] Inventors: Kenneth J. Salt, Dorchester; Colin A. Wintle, Wareham, both of England

[73] Assignee: United Kingdom Atomic Energy Authority, London, England

[21] Appl. No.: 825,048

[22] Filed: Aug. 16, 1977

[30] Foreign Application Priority Data

Aug. 18, 1976 [GB] United Kingdom ............... 34486/76

[51] Int. Cl.² ............................................. H01L 35/02
[52] U.S. Cl. ..................... 136/233; 73/341;
 73/359 R; 176/19 J; 136/230
[58] Field of Search ............... 176/19 J; 136/230, 233;
 73/359 R, 341

[56] References Cited

U.S. PATENT DOCUMENTS

| | | | |
|---|---|---|---|
| 2,677,772 | 5/1954 | Moon | 176/19 J |
| 3,230,771 | 1/1966 | Kealy et al. | 176/19 J |
| 3,459,925 | 8/1969 | Goosey et al. | 176/19 J |
| 3,512,413 | 5/1970 | Von Krusenstierna et al. | 136/230 |
| 3,862,574 | 1/1975 | Antoine | 136/231 |

*Primary Examiner*—Leland A. Sebastian
*Attorney, Agent, or Firm*—Larson, Taylor and Hinds

[57] ABSTRACT

A temperature measuring device for measuring temperatures at axially spaced positions along the bore of a tube comprises a sensor in the form of a central rigid wire of constantan base alloy on to which thermocouple foils are spot welded at prescribed locations. The foils are silver plated over half their length thus forming a silver/constantan thermojunction; the constantan end of the junction only being welded to the rigid wire. A copper wire is crimped to the silver plated end of each foil. The detector may be supported coaxially within a resistance heated tube and in use the temperatures sensed by the thermocouples are continuously monitored.

7 Claims, 1 Drawing Figure

U.S. Patent
Jul. 24, 1979
4,162,175
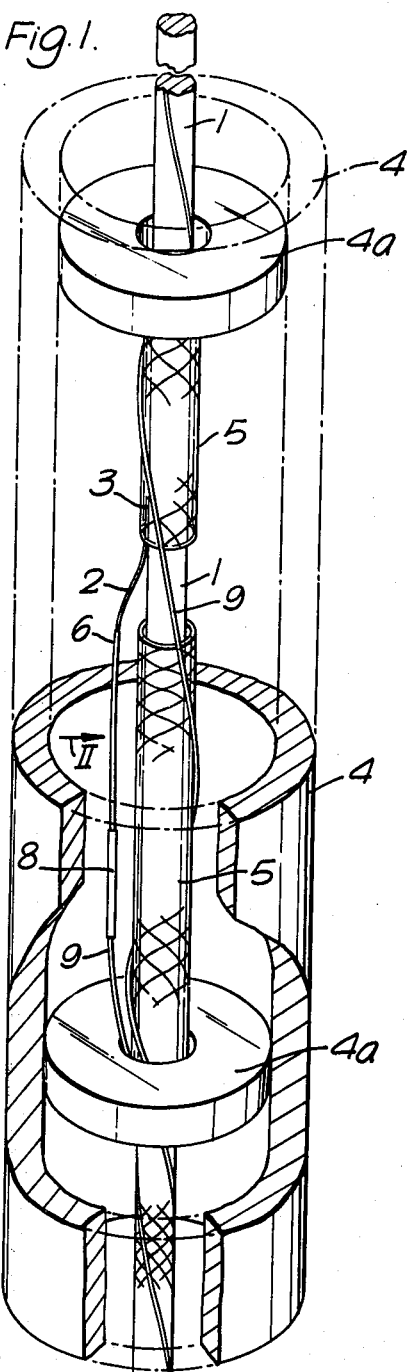
Fig. 1.
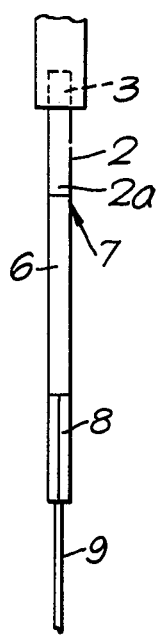
Fig. 2.
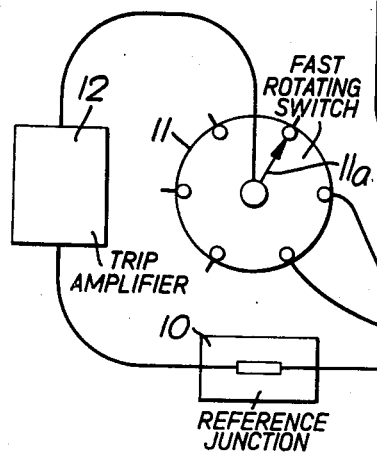

TEMPERATURE SENSORS

BACKGROUND OF THE INVENTION

This invention relates to temperature sensors which may be used for measuring temperatures within the bore of a tube or especially adapted for use in dry out detection apparatus. It is known that there is a certain condition which arises when a local region of a heat emitting rod cooled by convection is no longer wetted by liquid but is blanketed with a vapour film. This is a critical condition known as dry out and it is important to plant designers to have data relating to this condition so that its occurence is minimised. This is especially so where the heat emitting body is a nuclear fuel rod and experiments have been set up which simulate a fuel rod by the use of an electrical resistance heated rod of similar exterior shape. These rods are termed heaters and special heating electrical resistances have been used to give a predetermined, non uniform, variation in heat axially along the rod as well as uniform heat emission, or so called uniform axial heat flux distribution. Besides having the required heating resistor, the rod also incorporates a dry out detection means from which knowledge of the dry out temperatures and the preferential region or regions where the dry out temperatures occur, may be obtained. In the case where the rod is non-uniformly heated e.g. where the heat flux along the rod follows a cosine distribution the actual location of dry out region is very much dependent upon rig conditions and cannot be readily predetermined to better than say about ±30 cms. It is therefore necesssary to provide means for sensing temperature changes over several meters of heated length. One method employed to do this involves monitoring the resistance change in resistance thermometers by means of Wheatstone bridges in each of which two of the resistance sensors form arms of a bridge. Each bridge require regular re-balancing and with a large number of bridges, this task becomes impractical.

SUMMARY OF THE INVENTION

According to the present invention a temperature sensor assembly for measuring temperature within a tube bore includes at least one stringer for insertion into a tube the stringer comprising a central wire of homogeneous metal, the wire having exterior uninsulated regions axially spaced therealong with metal foil strips attached at one end to the wire at said regions, thermojunctions formed on unattached portions of said strips and an electrical conductor leading from the free end of each strip whereby temperature changes may be continuously sensed at a number of regions along the tube. Typically both the solid wire and the foil strips may be constantan alloy and an outer layer, which may be silver, applied over one half of the strip surface thus forming a silver-constantan thermojunction. Insulation for preventing contact between the thermojunction and the solid rod may be glass fiber fabric and this serves to keep the foil proud of the rod surface so that on assembly the flat, plated face of the foil strip faces the bore of the tube to sense radiant heat energy emitted by the bore. Preferably a black nickel flash coating is applied over the sensing surface of each foil to ensure true black body absorption. The free end of each foil is preferably crimped onto a flexible insulated copper wire which extends down the heater bore and out through a central hole in an end plug. The tube may be an electrical resistance heater for use in dry out experiments.

In its assembled and operative form the invention comprises a metal tube adapted to be heated by electrical resistance heating, the tube bore containing a series of axially spaced rings of refractory material and a temperature sensing stringer supported axially within the tube bore spaced from the bore wall by the rings.

DESCRIPTION OF THE DRAWINGS

In order that the invention may be better understood the following description of the design of a dry-out detection stringer is given. In the description reference will be made to the accompanying drawing in which FIG. 1 is a view in perspective of a stringer and part of a surrounding heater tube for use in dry out experiments, and FIG. 2 is a view in the direction of the arrow II showing the radiant heat-sensitive thermojunction.

DESCRIPTION OF THE PREFERRED EMBODIMENT

In the drawings, the stringer comprises a 2 mm wire 1 of constantan to the surface of which are welded a number of constantan foil strips 2, about 1.5 mm wide and 0.05 mm thick. Each foil strip 2 is bent outwardly from its attaching weld 3 so that its wider face 2a is directed towards the bore wall of a heater tube 4 from which the wire 1 is spaced by ceramic spacers 4a. A glass fibre sleeve such as 5 on the wire 1 insulates each foil from the wire 1. The outward facing surface 2a of each strip is partially plated with silver 6 so forming a thermojunction 7 and the whole surface is given a flash coating of nickel to darken the surface so that it absorbs radiation. The free end of each strip is crimped at 8 to the bared end of an insulated copper wire 9 which is insulated with glass fibre and loosely entwined around the central wire 1. Several such wires 8 extend along the length of the central wire which is common to the cold junction. Where the wire 8, 9 passes through the spacers 4a an insulating binding of glass fibre fabric is applied.

By the use of twelve foil strip thermojunctions a stringer of some 200 cms in length may be built up and the temperature limitation is that of the copper wire insulation which is kapton/glass braided and kapton covered, in current examples, but ceramic insulation is possible for higher temperatures although this will limit the flexibility of the stringer.

The central wire 1 is led through the bottom of the heater tube 4 to a reference junction 10 containing a junction of constantan and copper wire at a known temperature (conveniently zero degrees Centigrade). The several other wires 9 are connected to respective terminals of a fast rotating switch. A rotating switch arm 11a is operative to scan the terminals in quick succession. A trip amplifier 12 is connected to receive the respective emf's scanned by the switch as indicative of the temperatures sensed by the thermocouples inside the heater rod. In use the rod is placed in a coolant channel and energised. When the amplifier registers an excessive temperature above a preset threshold the heater rod is de-energised and the rotary switch provides an indication of the axial position along the rod where the excessive temperature arose. In this role the device serves as a dry out detector.

An alternative use of the device is as a multiposition thermometer for monitoring temperature in any empty tube.

We claim:

1. A temperature sensor assembly for measuring the temperature at axially spaced positions along the bore of a tube including at least one stringer for insertion into the tube bore the stringer comprising a central conductor of homogeneous metal, the conductor having an insulated exterior with axially spaced uninsulation regions, metal foil strips attached to said regions, thermojunctions formed on unattached portions of said strips, an electrical conductor leading from the free end of each strip, a reference thermojunction external to said tube, and scanning means connected to said electrical conductors for successively presenting the electrical outputs from said electrical conductors to measuring means for indicating the temperatues at axially spaced positions along said tube as represented by said outputs.

2. A tempeature sensor assembly as claimed in claim 1 in which the thermojunctions are formed on outwardly directed faces of the metal foil strips which faces are adapted to behave as black body absorbers.

3. A temperature sensor assembly as claimed in claim 1 in which the tube is an electrical resistance heater the central wire is spaced from the bore of the tube by axially spaced ceramic rings.

4. A temperature sensor assembly as claimed in claim 1 in which the central wire and the foils are of constantan and the foils are silver plated over a part remote from the wire to provide a silver constantan thermojunction.

5. A temperature sensor assembly as claimed in claim 1 in which the central wire is insulated with sleeves of refractory material.

6. A temperature sensor assembly as claimed in claim 5 in which the electrical conductors leading from the free ends of the foils are glass fibre insulated.

7. A temperature sensor assembly as claimed in claim 6 in which glass fibre binding is applied to the assembly at the regions where the assembly extends through the refractory spacers.

* * * * *